United States Patent [19]
Hirata

[11] Patent Number: 5,841,719
[45] Date of Patent: Nov. 24, 1998

[54] DATA LATCHING CIRCUIT FOR READ-OUT OPERATIONS OF DATA FROM MEMORY DEVICE

[75] Inventor: Masayoshi Hirata, Tokyo, Japan

[73] Assignee: NEC Corporation, Tokyo, Japan

[21] Appl. No.: 863,536

[22] Filed: May 27, 1997

[30] Foreign Application Priority Data

May 24, 1996 [JP] Japan .................................. 8-153049

[51] Int. Cl.⁶ .................................................. G11C 7/00
[52] U.S. Cl. .................... 365/210; 365/194; 365/189.05; 365/185.2
[58] Field of Search ............................. 365/210, 189.05, 365/189.07, 194, 185.2

[56] References Cited

U.S. PATENT DOCUMENTS

| | | | |
|---|---|---|---|
| 5,029,135 | 7/1991 | Okubo | 365/210 |
| 5,325,337 | 6/1994 | Buttar | 365/210 |
| 5,671,180 | 9/1997 | Higuchi | 365/210 |
| 5,694,369 | 12/1997 | Abe | 365/210 |

FOREIGN PATENT DOCUMENTS 57-103191  6/1982  Japan .

*Primary Examiner*—Tan T. Nguyen
*Attorney, Agent, or Firm*—Young & Thompson

[57] ABSTRACT

Dummy memory cells are provided which have substantially the same structure as the main memory cells. A main sense amplifier is provided for reading out data from the main memory cells. A dummy sense amplifier is provided for reading out data from the dummy memory cells. A data latching circuit is provided for latching the data outputted from the main sense amplifier. Read out operations from the dummy memory cells are made at the same time as the read out operations from the main memory cells. The data latch circuit latches data outputted from the main sense amplifier by utilizing the timing when the dummy sense amplifier outputs data of the dummy memory cells.

5 Claims, 11 Drawing Sheets

DATA LATCHING CIRCUIT FOR READ-OUT OPERATIONS OF DATA FROM MEMORY DEVICE

BACKGROUND OF THE INVENTION

The present invention relates to a semiconductor device and more particularly to a data latching circuit for read-out operations from a main memory cell. When data are read out from the semiconductor memory, data are detected by a sense amplifier and then once held in a data latching circuit in accordance with a data latching instruction signal which is controlled at any timing before data are output independently from output from the sense amplifier. This method provides the following effects.

First, whereas error data of the sense amplifier may be caused by operations of output buffer, the error data can be made invalid.

Second, if there is no variation of read out address, the sense amplifier is inactive to curtail current consumption.

Third, a batch of data of a plurality of bytes is held to allow a high speed output of data sequentially at word unit.

In order to cause the above first effect, it is required to latch data by data latching signal after data have been output from the sense amplifier and until the output buffer operates.

The following descriptions will be made with reference to FIG. 1, assuming that the memory device comprises a flash memory. FIG. 1 is a circuit diagram illustrative of a read-out circuit in flash memory.

An address displacement detection circuit 1 is provided for receiving inputs of address signals A0–An and outputting a pulse signal ATP if there is any variation of the address signals A0–An. An address decoder circuit 2 is also provided for receiving inputs of address signals A0–An and decoding the address signals A0–An for output of decoded signals WL0–WLn which are transmitted on word lines. A pulse width control circuit 3 is also provided for receiving input of the pulse signal ATP and outputting signals EQ and DLS having predetermined pulse widths. A data latching circuit is also provided for receiving output signal DSi from the sense amplifier 5 and latching the signal DSi in accordance with latch timing signal DLS until data signals Di are output. A sense amplifier circuit 5 is also provided for comparing currents on bit lines BL to a current on reference bit line VR and outputting signals DSi as a result of the read out from the memory cell. A reference circuit is also provided for defining the current on the reference bit line VR. A memory cell array 7 is provided which has floating gates wherein gates are connected to word lines, sources are grounded and drains are connected to the bit lines BL.

Operations of the above circuits will be described as follows with reference to FIG. 2. FIG. 2 is a circuit diagram illustrative of an ATD circuit, a plurality of which are provided in the address displacement detection circuit 1. The ATD circuit 10, 11, 12 comprises a delay circuit 101 and an Exclusive OR gate 102. The delay circuit 101 receives the address signal "An" and output a delay signal "a". The Exclusive OR gate 102 receives both the address signal "An" and the delay signal "a" and output a signal "ATPn".

Operations of the ATD circuit will subsequently be described. If the address signal changes in level from high level to low level or from low level to high level, then the output signal "a" has the same signal waveform as the address signal but has a time delay from the address signal. The Exclusive OR gate 102 keeps the output signal "ATPn" in high level of the time of delay.

For the above reasons, the address displacement detection circuit 1 makes a pulse signal "ATP0"–"ATPn" high level if an address signal A0–An corresponding to the pulse signal "ATP0"–"ATPn" is varied in level. The signals are then transmitted through the logic gates 13 and 14 to output an ATP signal.

FIG. 3 is a circuit diagram illustrative of the pulse width control circuit 3. The pulse width control circuit 3 comprises a delay circuit 111 for receiving input of the signal ATP and outputting an output signal "b", a delay circuit 112 for receiving an input of the signal "b" and outputting a signal "c". An OR gate is provided for receiving inputs of the signal ATP and the signal "b" and outputting an equalize signal EQ. The OR gate comprises a NOR gate 114 and an invertor 116. Another OR gate is provided for receiving inputs of the signal ATP and the signal "c" and outputting a data holding signal DLS. The other OR gate comprises a NOR gate 113 and an invertor 115.

If the signal ATP has the high level, then the equalize signal EQ also has the high level so that the delay circuit generates the high level equalize signal EQ in the form of pulse for a certain time. The signal DLS is also kept by delay circuits 111 and 112 in high level for a certain time, provided the pulse width is not more than two times of the pulse width of the signal ATP.

FIG. 4 is a circuit diagram illustrative of a data latch circuit of FIG. 1. The data latch circuit 4 receives inputs of the signal DSi from the sense amplifier as well as a data latch signal DLS from the pulse width control circuit 3 and outputting a signal Di. The signal DSi is inputted into a CMOS invertor which is activated by the high level of the signal DLS. The CMOS invertor comprises a p-channel transistor 127 and an n-channel transistor 128. The signal DLS is then transmitted through an invertor 124 to a terminal Di. The signal DLS is supplied to control ON-OFF operations of a CMOS transfer gate 125 which is placed between the output of the invertor 123 and the input of the invertor 124.

If the signal DLS is the high level, then a p-channel transistor 126 and an n-channel transistor 129 turn ON, where the signal DLS is inverted by an invertor 121 before inputted into the p-channel transistor 126. Data are transmitted through the CMOS invertor and the invertor 124 to the terminal Di. If the signal DLS becomes low, then data of the signal Di is latched by the invertors 123 and 124 and the transfer gate 125.

FIG. 5 is a circuit diagram illustrative of a sense amplifier circuit 5 and a reference circuit 6 in FIG. 1. A bit line BL is connected to the memory cells. If the selected memory cell is in the ON state, then the bit signal is in the low level. The low level bit signal is transmitted to the invertor 511 and inverted to the high level bit signal for subsequent transmission to the gate of the n-type enhancement transistor 500 whereby the n-type enhancement transistor 500 turns ON. A current flows from the power source. If the selected memory cell is in the OFF state, then the transistor 505 is placed in the OFF state. The reference circuit 6 has an n-type enhancement transistor 60 which has a source grounded and a drain connected to a reference bit line VR as well as a gate which is connected through resistances 61 and 62 to a power source. The gate electrode of the n-type enhancement transistor 60 is applied with a bias voltage from the power source. The sense amplifier circuit 5 has a differential amplifier which comprises a differential pair and a current mirror circuit as a load to the differential pair. The differential pair comprises n-type transistors 506 and 507 which gates are connected to nodes "d" and "e" respectively. Source of the n-type transistors 506 and 507 are commonly connected to an n-type transistor 508 which serves as a constant current source. Drains of the n-type transistors 506 and 507 are connected to p-type transistors 501 and 502 both of which are in the form of the current mirror circuit. An output DDi of the differential amplifier appears at an connective portion of the drains of then-type transistor 506 and the p-type transistor 501. The connective portion is connected to an invertor 514. The output DDi of the differential amplifier is fetched from the connective portion between the drains of the n-type transistor 506 and the p-type transistor 501. The signal DDi is then transmitted to the invertor 514 to generate an output signal DSi from the sense amplifier 5.

A current on the signal line VR connected to the reference circuit 6 is compared to a current on the bit line BL connected to the memory cell to and further amplified by the differential amplifier to generate the output signal DSi. The signal EQ inputted into the sense amplifier 5 is transferred to the transfer gates 510 and 515 to generate equipotential of signals "d" and "e" to be differential pair transistors 510 and 515.

Operations of the circuit of FIG. 1 will be described with reference to FIG. 6 which is view illustrative of waveforms of signals transmitted in the circuit.

If an address signal "An" is inputted, the address decoder circuit 2 selects a word line "WL0". At the same time, the address signal "An" is also inputted into the address displacement detection circuit 1 whereby a signal "ATP" is outputted. The signal "ATP"is then inputted into the pulse width control circuit 3 to generate an equalize signal "EQ" in the form of a pulse signal having a predetermined width as well as data latch signal "DLS" in the form of a pulse signal having a predetermined width.

The equalize signal "EQ" is inputted into the sense amplifier 5 whereby during the high level of the equalize signal "EQ", the bit lines "BL" and the reference bit line "VR" have a equipotential and also the signals "d" and "e" have the equipotential.

After the equalize signal "EQ" becomes low level, the sense amplifier 5 enters into the read out operation to read out informations from the memory cells.

In case of this sense amplifier 5, with reference to FIG. 5, if the memory cell 70 is in the ON state, then the node "d" has a lower potential than the node "e". Since the gate of the n-type transistor 506 has the same potential as of the node "d", the potential of the drain of the n-type transistor 506 and the node "DDi" become high level. If the memory cell 70 is in the OFF state, then the node "d" has a higher potential than the node "e", whereby the node "DDi" becomes low level.

The potential of the node "DDi" is inverted by the invertor 514 and then outputted as an output signal "DSi" from the sense amplifier 5 and transmitted to the date latch circuit 4.

The date latch circuit 4 outputs an output signal "Di" having the same data as the signal "DSi" when the signal "DLS" is in the high level. If, however, signal "DLS" is fallen from the high level to the low level, data of the signal "DSi" are latched so that during the low level of the signal "DLS", the data latched are continued to be outputted as the signal "Di" The read out operations are made as described below.

The above conventional circuit has the following problems. Variation in potential of the power source causes a difference in timing between the output of the data latch signal and the read out data output.

The reason for those will be described with reference to FIG. 6. Read line represents signal waveform when the power source potential is high. It takes a time "tD1" after the data "Di" is outputted and until data are latched in accordance with the data latch signal "DLS". Broken line represents signal waveform when the power source potential is low. It takes a time "tD2" after the data "Di" is outputted and until data are latched in accordance with the data latch signal "DLS".

Since "tD1" is shorter than "tD2", this means it takes a longer time until the data are latched when the power source potential is low. This also means that the timing of operating the output buffer is also delayed to provide a large influence to the access speed.

In order to avoid the above problems, it was proposed to change the timing of entering the signal "DLS" into the low level by the power source voltage so that it is possible to set "tD1" and "tD2" at the same value. Notwithstanding, it is required to provide a plurality of circuits for judgment to power voltage and a circuit for changing the pulse width of the signal "DLS" in accordance with the voltage judgment signal. This additional circuits enlarges the circuit scale and the chip size. Since the pulse width of the signal "DLS" is discontinuously changed between after and before the power voltage judgment, it is difficult to realize the data latch operation at the constant timing.

In the above circumstances, it has been required that no difference is caused in the timing between the output of the data latching signal and the output of the read out data even if the power voltage is varied, in order to minimize the waiting time for waiting operations of the data output buffer and improve the access speed.

It has also been required that after the read out data are outputted, data latching signal is output so that it is impossible to latch any error data for the purpose of improvement in reliability of the device.

SUMMARY OF THE INVENTION

Accordingly, it is an object of the present invention to provide a novel data latch circuit for latching data in read out operation from memory cells, free from the problems as described above.

It is a further object of the present invention to provide a novel data latch circuit, wherein no difference is caused in the timing between the output of the data latching signal and the output of the read out data even if the power voltage is varied, in order to minimize the waiting time for waiting operations of the data output buffer and improve the access speed.

It is a further more object of the present invention to provide a novel data latch circuit, wherein after the read out data are outputted, data latching signal is output so that is impossible to latch any error data for the purpose of improvement in reliability of the device.

The above and other objects, features and advantages of the present invention will be apparent from the following descriptions.

In accordance with the present invention, dummy memory cells are provided which have substantially the same structure as the main memory cells. A main sense amplifier is provided for reading out data from the main memory cells. A dummy sense amplifier is provided for reading out data from the dummy memory cells. A data latching circuit is provided for latching the data outputted from the main sense amplifier. Read out operations from the dummy memory cells are made at the same time as the read out operations from the main memory cells. The data latch circuit latches data outputted from the main sense amplifier by utilizing the timing when the dummy sense amplifier outputs data of the dummy memory cells.

In accordance with the present invention, a main memory cell data read out circuit for reading out data from the main memory cells. The main memory cell data read out circuit comprises main memory cells and a main sense amplifier. A data latching circuit is provided for latching data read out from the main memory cells in accordance with a data latching signal. A data latching signal generator is provided for generating the data latching signal. The data latching signal generation is further provided with a dummy memory cell, a dummy sense amplifier for reading out data from the dummy memory cell, a data displacement detecting circuit for detecting data displacement points at a time when the dummy sense amplifier outputs data obtained from the dummy memory cell, and a delay circuit for receiving input of the data displacement detection signal and outputting the data latching signal as a delay signal of the data displacement detection signal.

As described above, in accordance with the present invention, data are read out from the dummy memory cells so that the data latching signal is outputted at a time when the data are outputted so as to latch the data of the main memory cells.

More concretely, the data latch signal generator is provided with the following elements. The dummy memory cell is provided, which has the same structure as the main memory cell. The dummy sense amplifier is provided for reading out the data from the dummy memory cells. A data displacement detection circuit is provided for detecting a data displacement point at a time when the dummy sense amplifier outputs data of the dummy memory cells and outputs a data displacement detection signal. The delay circuit is provided for the receiving the input of the data displacement detection signal and outputting the data latch signal as the delay signal of the data displacement detection signal.

In accordance with the present invention, the data are read out from the dummy memory cells at the same time when the data are read out from the main memory cells. The sense amplifier for the dummy memory cell outputs the dummy memory cell data. At the same time, data are read out from the main memory cells and outputted as correct data. For those reasons, the data latching signal is output for latching data of the main memory cells at the timing when the sense amplifier of the dummy memory cells outputs the dummy memory cell data.

BRIEF DESCRIPTIONS OF THE DRAWINGS

Preferred embodiments of the present invention will be described with reference to the accompanying drawings.

PREFERRED EMBODIMENTS

A first embodiment according to the present invention will be described in detail with reference to the accompanying drawings.

Figure 7:
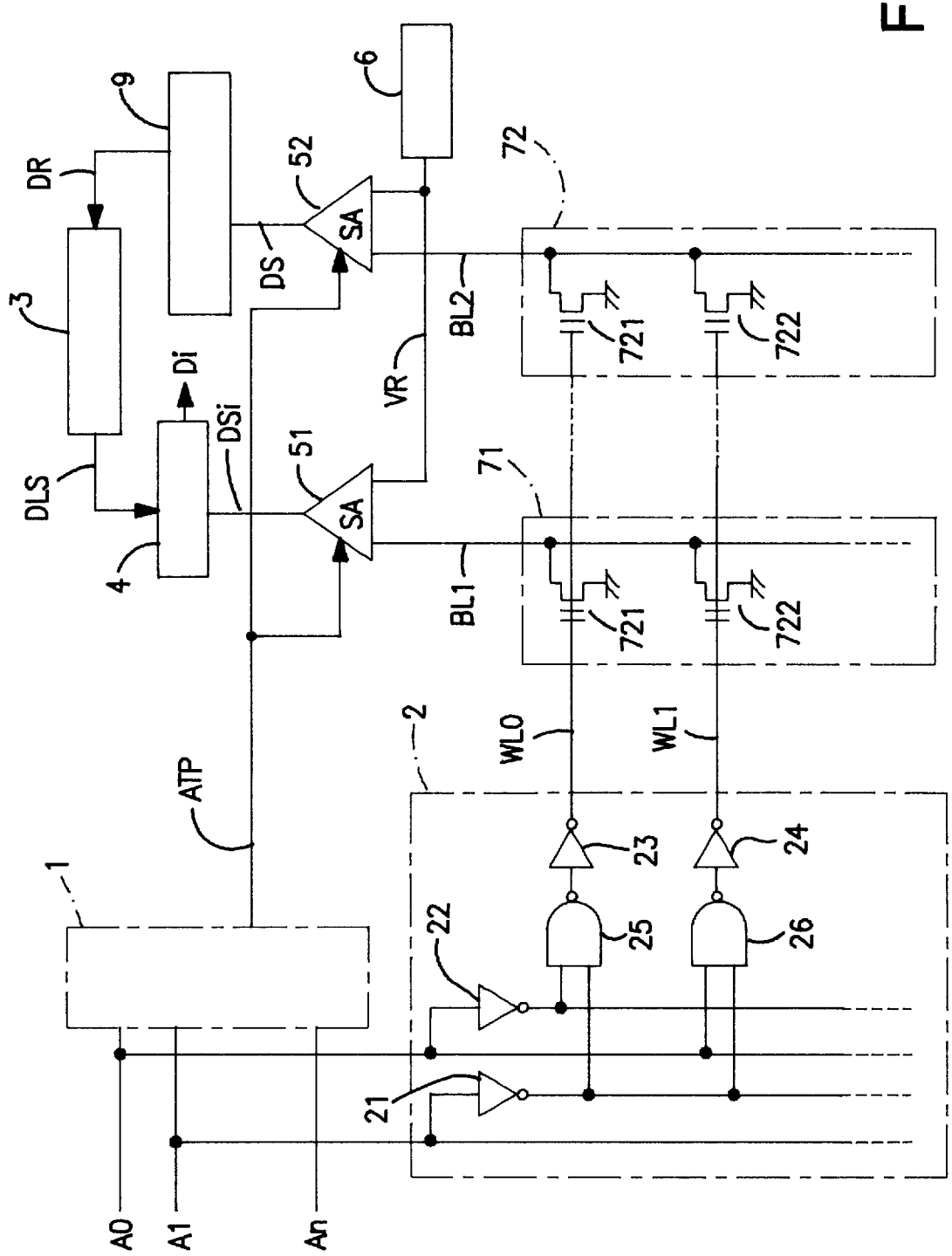
FIG. 7 is a circuit diagram illustrative of a data latching circuit for latching data read out from memory cells in a first embodiment according to the present invention.

FIG. 7 is a circuit diagram illustrative of a data latching circuit for latching data read out from memory cells in a first embodiment according to the present invention.

The data latching circuit has the following circuits. An address displacement detection circuit 1 is provided for receiving inputs of address signals "A0"–"An" and outputting a signal "ATP" when the address signals are changed. An address decoder circuit 2 is provided for receiving inputs of the address signals "A0"–"An" to decode the address signals "A0"–"An" and outputting the decoded signals onto word lines "WL0", "WL1"–. A data displacement detection circuit 9 is provided for receiving inputs of data signals "DS" from a dummy sense amplifier 52 and outputting signals "DR". A delay circuit 3 is provided for receiving, as input, the signal "DR" and outputting a delay signal "DLS". A data latching circuit 4 is provided for latching the signals "DSi" received from a main sense amplifier 51 in accordance with the signal "DLS" and outputting data signals "Di".

Further the following circuits are provided. A main sense amplifier circuit 51 is provided for comparing currents on a bit line "BL1" with currents on a bit line "VR" and outputting signals "DSi" of data read out from a main memory cell 71. A dummy sense amplifier 52 is provided for comparing currents on a bit line "BL2" with currents on a bit line "VR" and outputting signals "DS" of data read out from a dummy memory cell 72. A reference voltage generation circuit 6 is provided for deciding currents on the reference bit line "VR". A main memory cell array 71 is provided which includes transistors each having a floating gate connected to the word line, a source connected to the ground line and a drain connected to the bit line "BL1". A dummy memory cell array 72 is provided which includes transistors each having a floating gate connected to the word line, a source connected to the ground line and a drain connected to the bit line "BL2".

Figure 1:
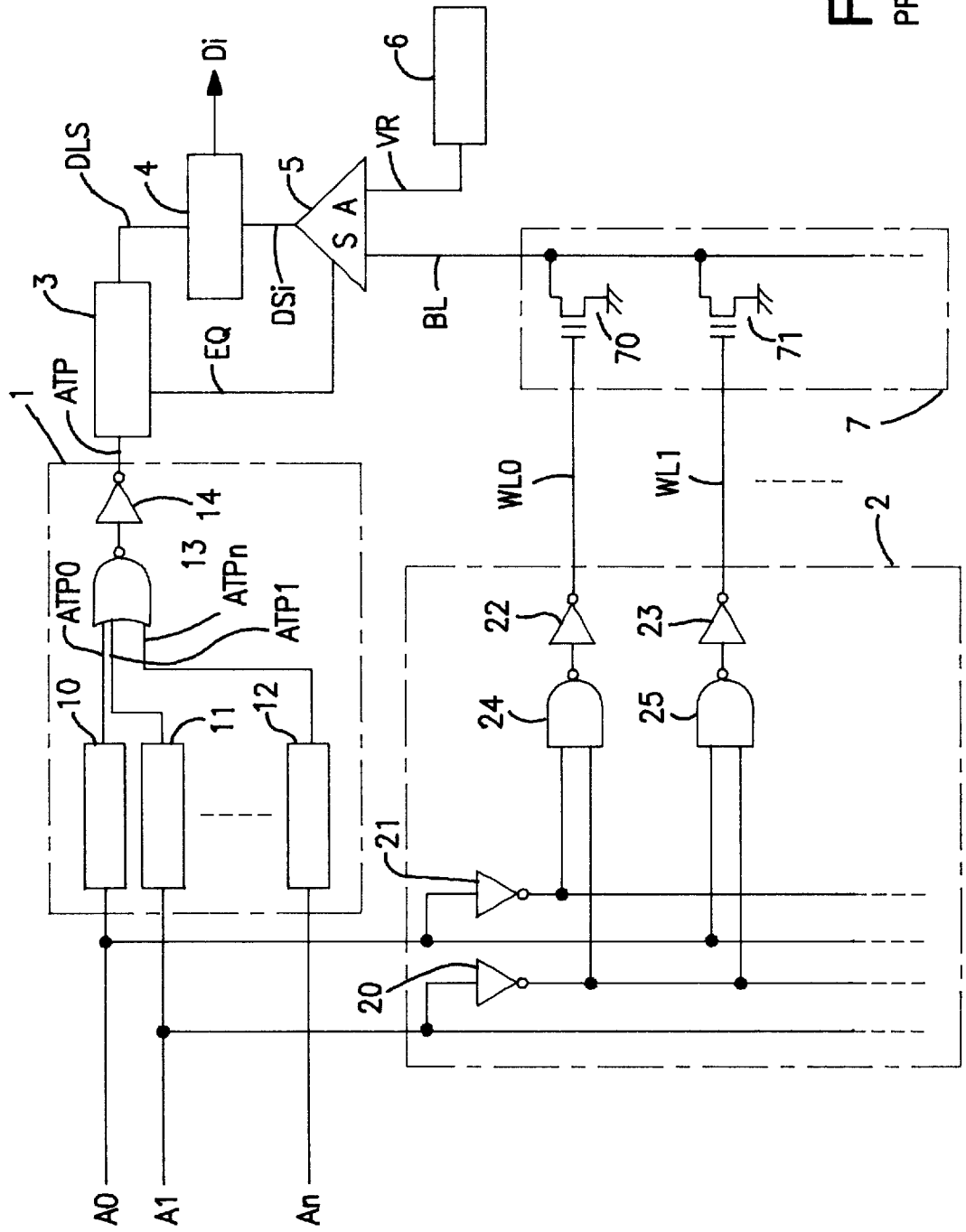
FIG. 1 is a circuit diagram illustrative of a read-out circuit in flash memory.
Figure 2:
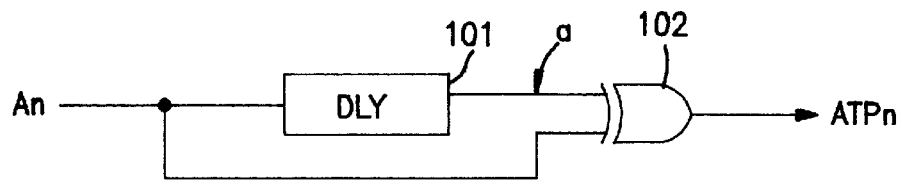
FIG. 2 is a circuit diagram illustrative of an ATD circuit.
Figure 3:
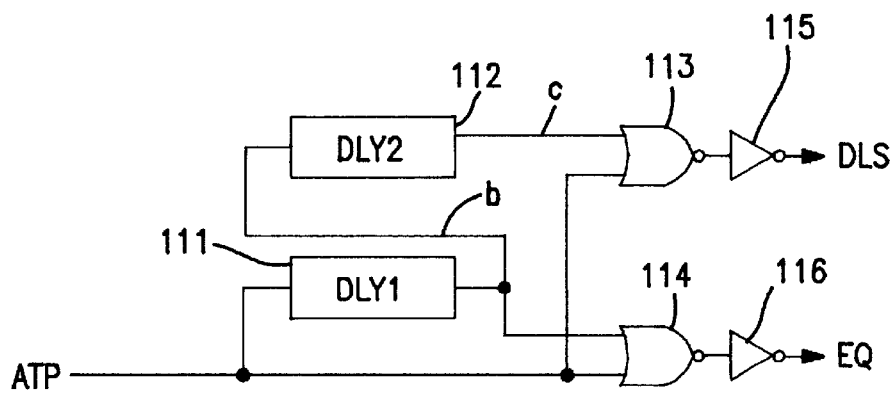
FIG. 3 is a circuit diagram illustrative of the pulse width control circuit 3.
Figure 4:
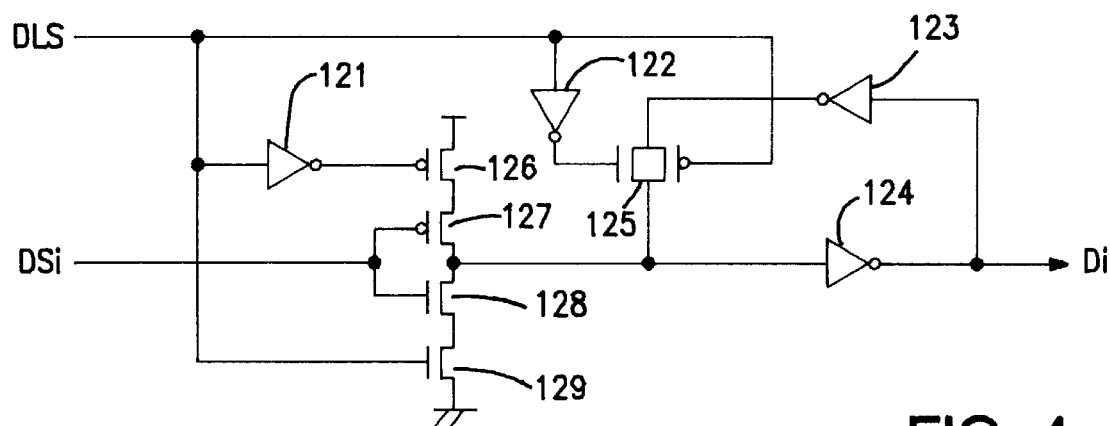
FIG. 4 is a circuit diagram illustrative of a data latch circuit of FIG. 1.
Figure 5:
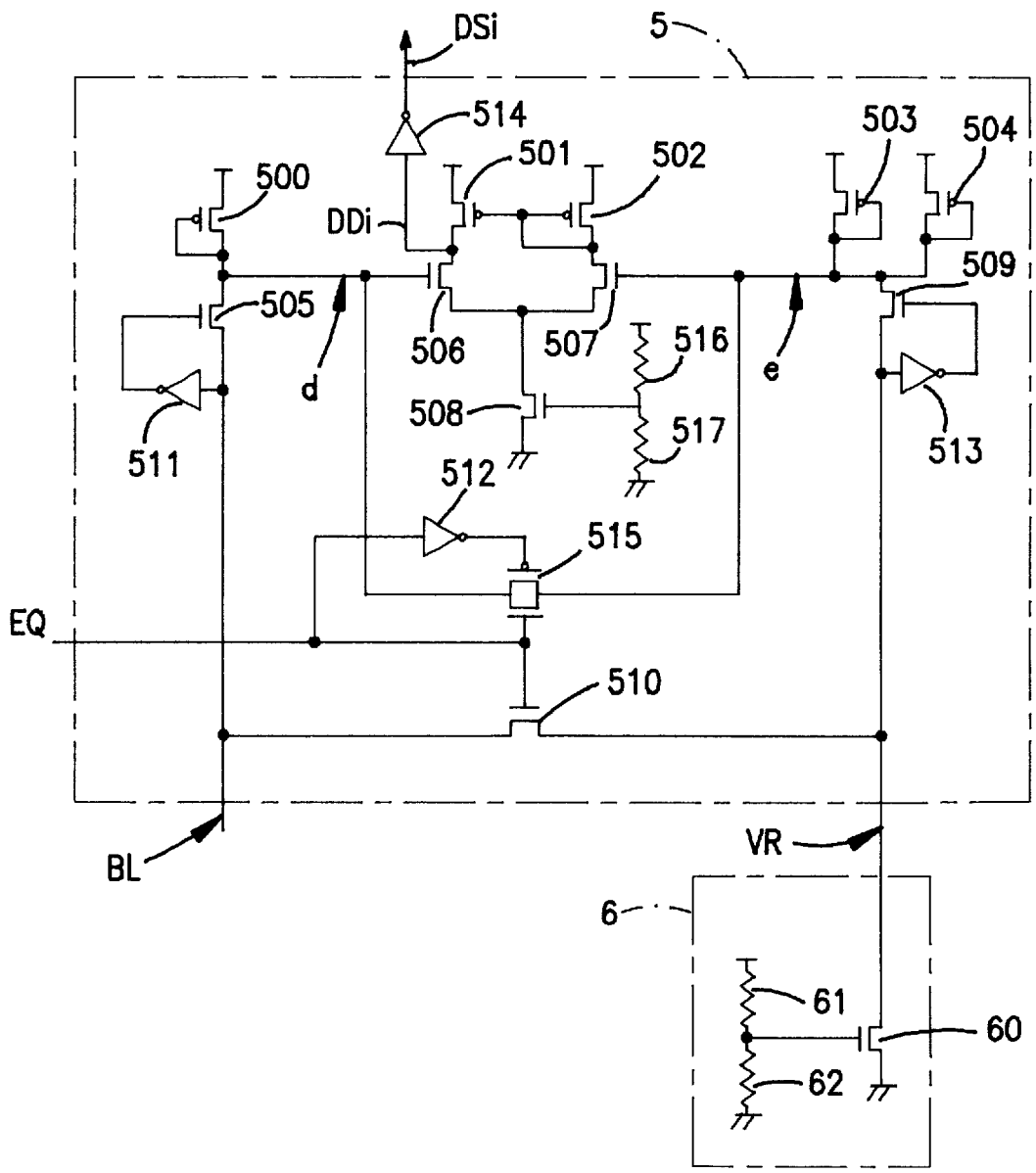
FIG. 5 is a circuit diagram illustrative of a sense amplifier circuit 5 and a reference circuit 6 in FIG. 1.
Figure 8:
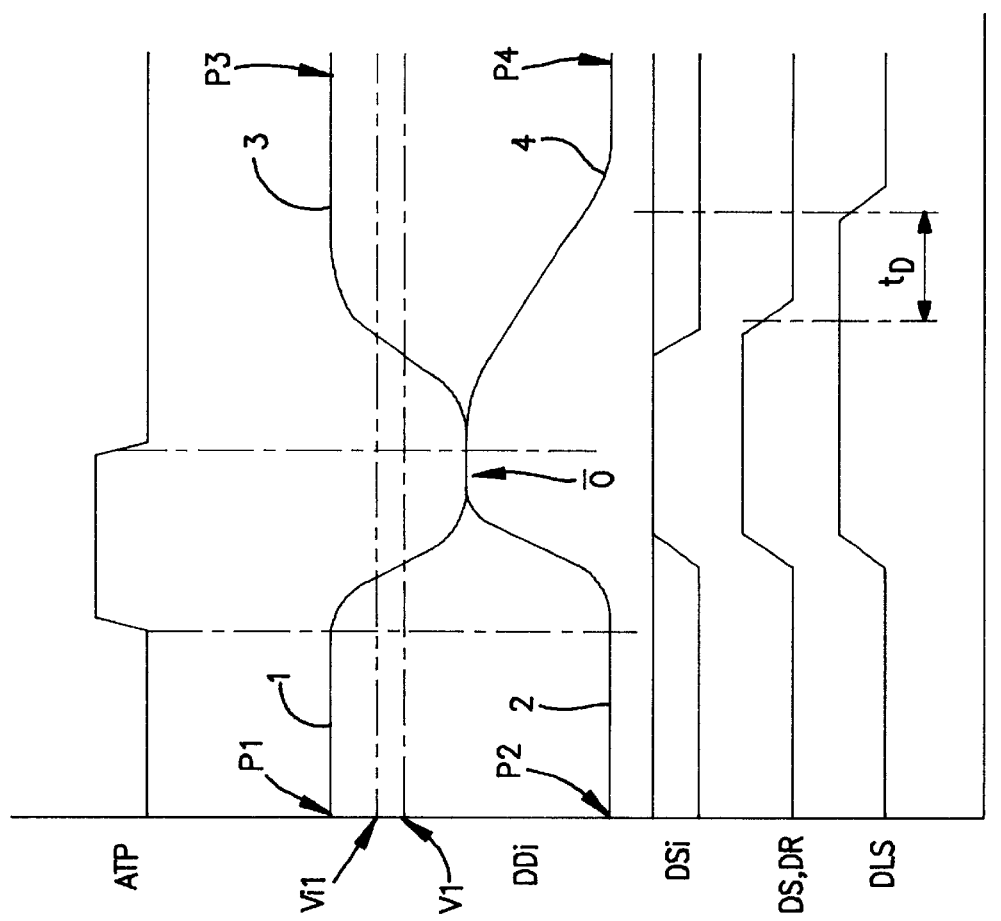
FIG. 8 is a diagram illustrative of waveforms of signals transmitted in the circuit of FIG. 7 wherein all of the dummy memory cells in the dummy memory cell array 72 are in the ON state.
Figure 6:
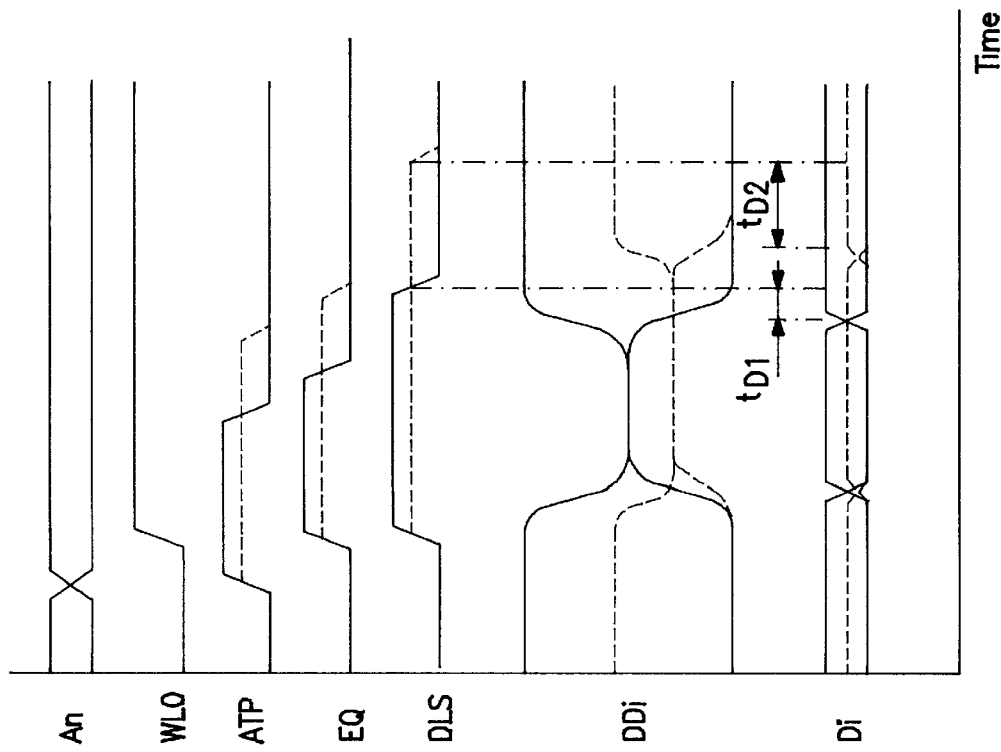
FIG. 6 is view illustrative of waveforms of signals transmitted in the circuit.

FIG. 8 is a diagram illustrative of waveforms of signals transmitted in the circuit of FIG. 7, wherein all of the dummy memory cells in the dummy memory cell array 72 are in the ON state. Address signals "A0"–"An" and word signals "WL0"–"WL1" are omitted from FIG. 8.

When address signals "A0"–"An" are inputted, the address displacement detection circuit 1 outputs the signal "ATP" in the high level and selects the word line.

The signal "ATP" outputted from the address displacement detection circuit 1 is then inputted into the main sense amplifier 51 whereby the output signal "DDi" from a differential amplifier stage in the sense amplifier is converged into a potential between the power voltage and the ground potential.

At that time, two output waveforms may be considered for the main sense amplifier 51 which reads out data from the main memory cell array 71. One is the read out from the cells in the initial ON state wherein the waveform corresponds a line segment (1) from a middle point "P1" to a point "O". Another is the read out from the cells in the initial OFF state wherein the waveform corresponds a line segment (2) from a middle point "P2" to a point "O".

If all of the dummy memory cells in the dummy memory cell array 72 are in the ON state, then the invertor in the main sense amplifier for receiving the input of the signal "DDi" has a threshold voltage level "V1" which is higher than the point "O". The output signal "DSi" depends upon the above two routs of the waveform.

If the signal "DDi" takes the first route represented by the line segment (1), then the output signal "DSi" from the main sense amplifier 51 shows a change from low level to high level when the line segment (1) across the threshold voltage "V1".

In the other hand, if the signal "DDi" takes the second route represented by the line segment (2), then the output signal "DSi"from the main sense amplifier 51 remains at the high level.

The following output waveforms may be considered for the dummy sense amplifier 52 for generating data latch pulse signals.

Since the initial state of the memory cells are in the ON state, the waveform of the signal takes the line segment (1) from a point "P1" to the point "O". The threshold voltage level of the invertor, into which the signal "DDi" from the differential amplifier is inputted, is set at a voltage level "VL1" which is higher than the point "O" and threshold voltage "V1". Output signal "DS" from the dummy sense amplifier 52 is risen just prior to commencement of rising the signal "DSi" from the main sense amplifier 51.

The signal "DS" from the dummy sense amplifier 52 is inputted into the data displacement detection circuit 9 and a signal "DR" is outputted from the data displacement detection circuit 9. The signal "DR" is risen with synchronous to the rising the of the signal "DS".

Subsequently, the signal "ATP" is fallen to the low level, whereby the main sense amplifier 51 and the dummy sense amplifier 52 are commenced to detect cell states of the main memory cell array 71 and the dummy memory cell array 72.

There may be considered the following two output waveforms from the main sense amplifier 51. One is the read out from the cells in the ON state wherein the waveform corresponds a line segment (1) from a middle point "O" to a point "P3". Another is the read out from the cells in the OFF state wherein the waveform corresponds a line segment (2) from a middle point "O" to a point "P4".

If the signal "DDi" takes the line segment (3), the signal "DSi" is changed from high level to low level when the line segment (3) across the threshold voltage V1.

On the other hand, if the signal "DDi" takes the line segment (4), the signal "DSi" remains fixed at the high level.

Output signal from the dummy sense amplifier 52 for generating data latch signals takes the line segment (3) from the middle point "O" to the point "P3" Since the threshold voltage level of the invertor 514 into which the signal "DS" is inputted, is set at a voltage level "VL1". The signal "DS" from the dummy sense amplifier is risen just after output signals from the main sense amplifier 51 are risen.

The signal "DS" from the dummy sense amplifier 52 is inputted into the data displacement detection circuit 9 and the signal "DR" is outputted from the data displacement detection circuit 9. The signal "DLS" is fallen to the low level in synchronous to the fall of the signal "DR" after the delay time "tD".

The signal "DLS" is fallen whereby the signal "DSi" from the main sense amplifier 51 is latched and the signal "Di" is outputted.

If the delay time "tD" is set short, the signal "Di" is latched almost at the same time as the output from the main sense amplifier 51 is decided, for which reason the timing of generation of the data latch signal "DLS" is automatically set at the optimum value without consideration of the power source voltage variation.

Figure 9:
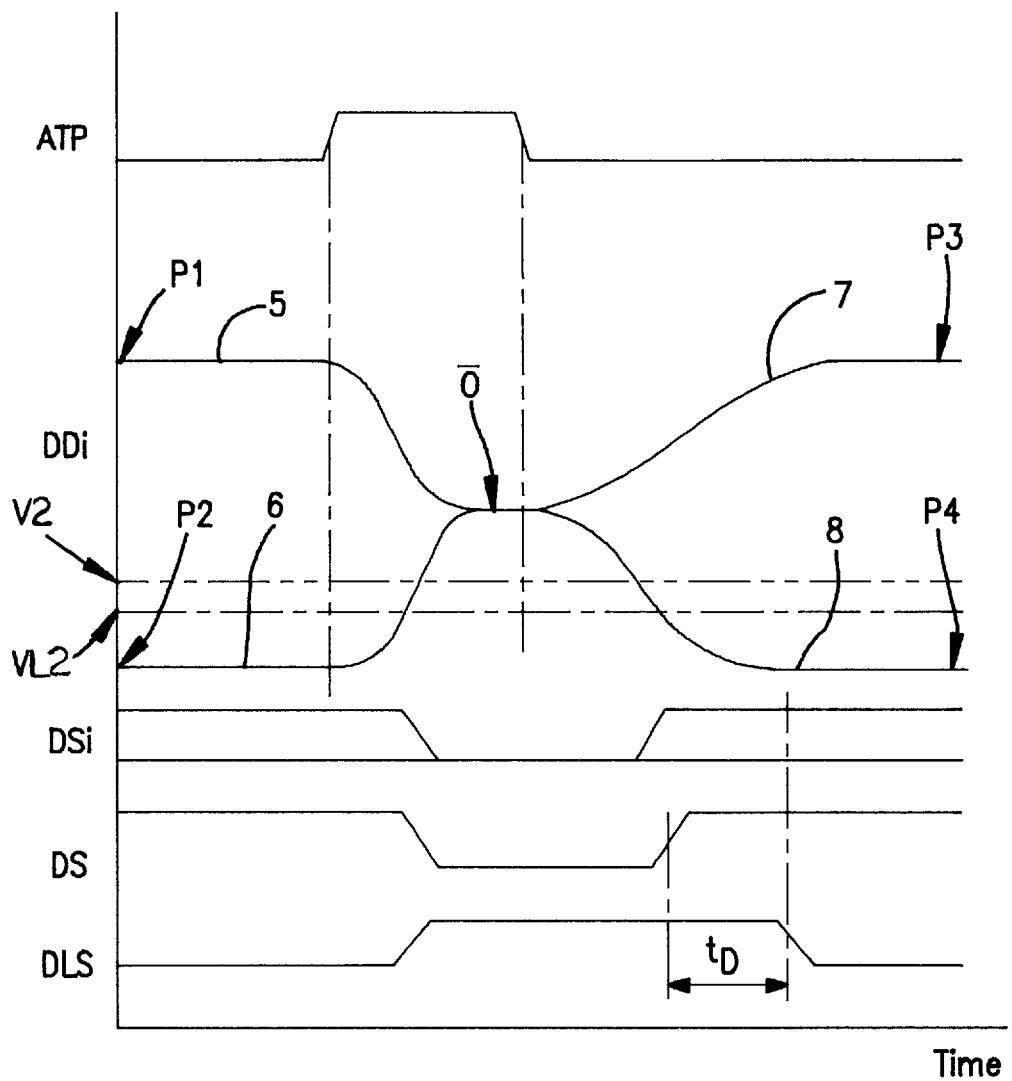
FIG. 9 is a diagram illustrative of waveforms of signals transmitted on the circuit of FIG. 7.

Subsequently, operations of the circuits, when all of the dummy memory cells in the dummy memory cell array 72 are in the OFF state, will be described with reference to FIG. 9 which is a diagram illustrative of waveforms of signals transmitted on the circuit of FIG. 7.

When all of the dummy memory cells in the dummy memory cell array 72 are in the OFF state, the threshold voltage of the invertor into which the signal "DDi" from the differential amplifier stage of the main sense amplifier 51 is inputted is set at a voltage level "V2" lower than the threshold voltage level "o". The threshold voltage of the invertor into which the signal "DDi" from the differential amplifier stage of the dummy sense amplifier 52 is inputted is set a voltage level "VL2" lower than the threshold voltage level "O" and the voltage "V2".

It is possible to generate a data latch signal when all the dummy memory cells in the dummy memory cell array 72 are in the OFF state, providing the same effect as described above.

Since all the dummy memory cells in the dummy memory cell array 72 are in the OFF state, it sis permitted that a junction capacitance of the memory cell is added to the bit line "BL2" and it is not necessary to use the real memory cell.

Figure 10:
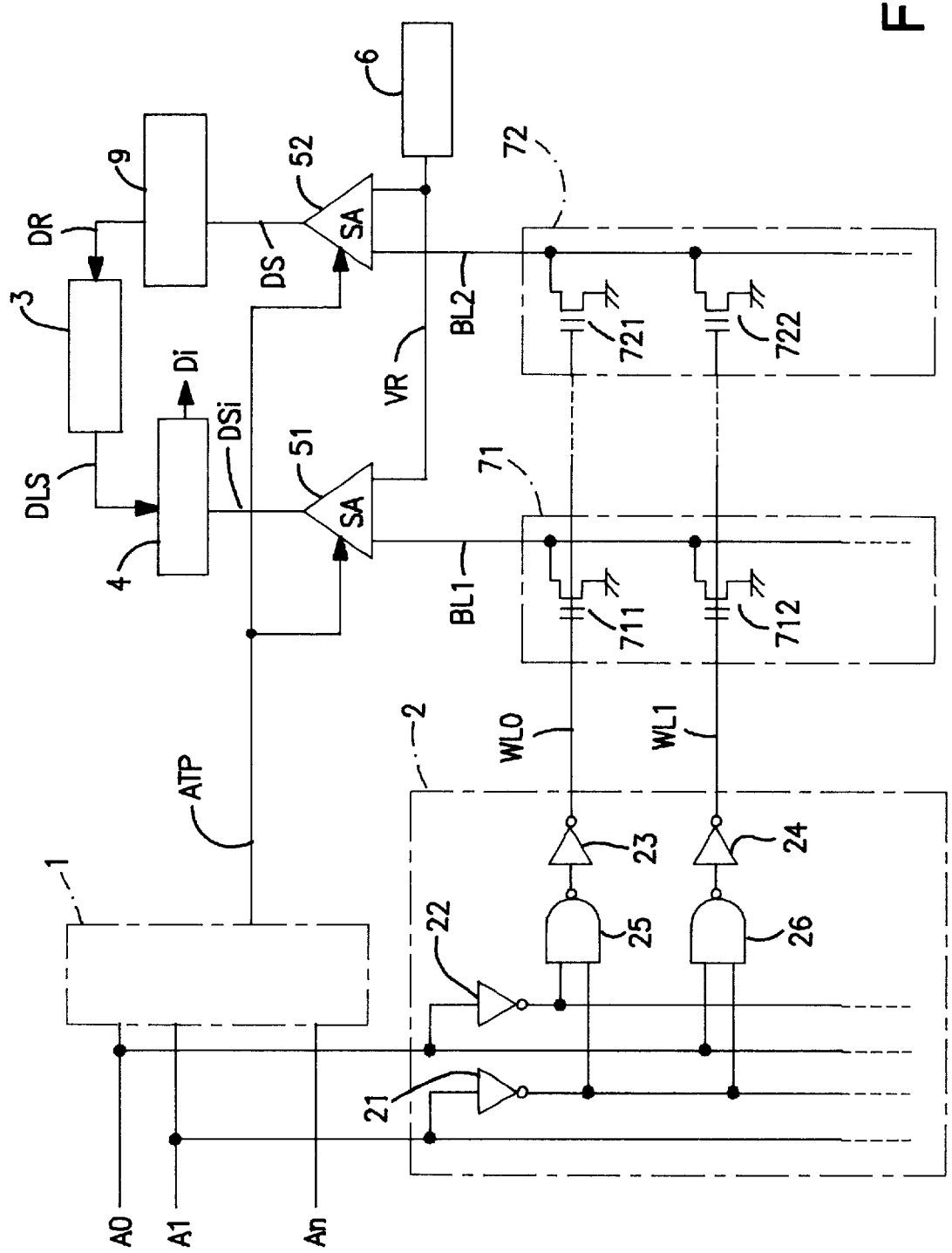
FIG. 10 is a circuit diagram illustrative of a data latch circuit in read out operations in the first embodiment according to the present invention.

FIG. 10 is a circuit diagram illustrative of a data latch circuit in read out operations in the first embodiment according to the present invention.

The data latching circuit has the following circuits. An address displacement detection circuit 1 is provided for receiving inputs of address signals "A0"–"An" and outputting a signal "ATP" when the address signals are changed. An address decoder circuit 2 is provided for receiving inputs of the address signals "A0"–"An" to decode the address signals "A0"–"An" and outputting the decoded signals onto word line "WL0", "WL1"—. A data displacement detection circuit 9 is provided for receiving inputs of the data signals "DS" from a dummy sense amplifier 52 and outputting signals "DR". A delay circuit 3 is provided for receiving an input of the signal "DR" and outputting a delay signal "DLS". A data latching circuit 4 is provided for latching the signals "DSi" received from a main sense amplifier 51 in accordance with the signal "DLS" and outputting data signals "Di".

Further the following circuits are provided. A main sense amplifier circuit 51 is provided for comparing currents on a bit line "BL1" with currents on a bit line "VR" and outputting signals "DSi" of data read out from a main memory cell 71. A dummy sense amplifier 52 is provided for comparing currents on a bit line "BL2" with currents on a bit line "VR" and outputting signals "DS" of data read out from a dummy memory cell 72. A reference voltage generation circuit 6 is provided for deciding currents on the reference bit line "VR". A main memory cell array 71 is provided which includes transistors each having a floating gate connected to the word line, a source connected to the ground line and a drain connected to the bit line "BL1". A dummy memory cell array 72 is provided which includes transistors each having a floating gate connected to the word line, a source connected to the ground line and a drain connected to the bit line "BL2".

Figure 11:
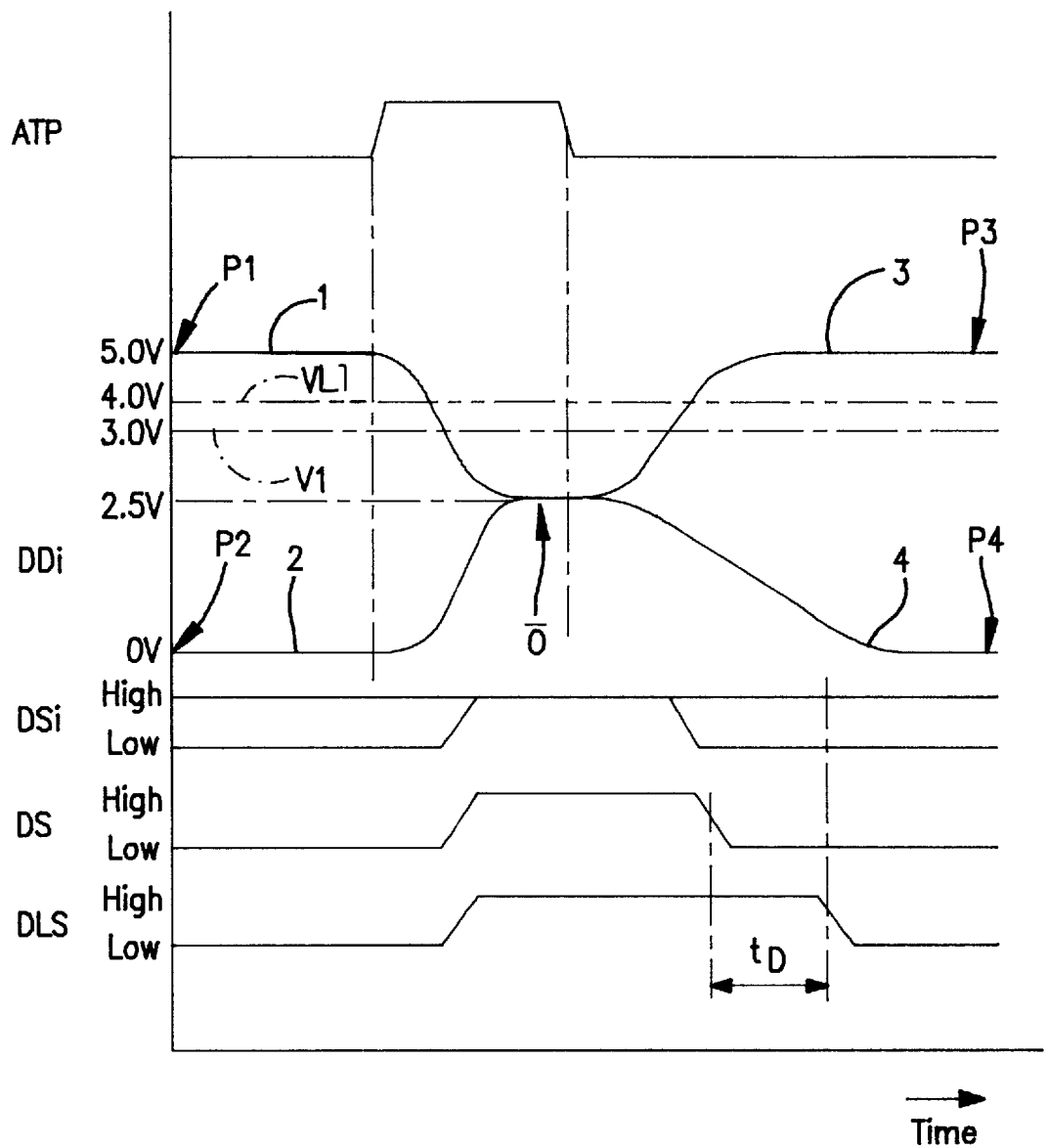
FIG. 11 is a diagram illustrative of waveforms of signals transmitted in the circuit of FIG. 10.

FIG. 11 is a diagram illustrative of waveforms of signals transmitted in the circuit of FIG. 10, wherein all of the dummy memory cells in the dummy memory cell array 72 are in the ON state. Address signals "A0"–"An" and word signals "WL0"–"WL1" are omitted from FIG. 10.

When address signals "A0"–"An" are inputted, the address displacement detection circuit 1 outputs the signal "ATP" in the high level and selects the word line.

The signal "ATP" outputted from the address displacement detection circuit 1 is then inputted into the main sense amplifier 51 whereby the output signal "DDi" from a differential amplifier stage in the sense amplifier is converged into a potential 2.5 V between the power voltage 5 V and the ground potential 0 V.

At that time, two output waveforms may be considered for the main sense amplifier 51 which reads out data from the main memory cell array 71. One is the read out from the cells in the initial ON state wherein the waveform corresponds a line segment (1) from a middle point "P1" to a point "O". Another is the read out from the cells in the initial OFF state wherein the waveform corresponds a line segment (2) from a middle point "P2" to a point "O".

If all of the dummy memory cells in the dummy memory cell array 72 are in the ON sate, then the invertor in the main sense amplifier for receiving he input of the signal "DDi" has a threshold voltage level 3.0 V which is higher than the point 2.5 V. The output signal "DSi" depends upon the above two routs of the waveform.

If the signal "DDi" takes the first route, represented by the line segment (1), then the output signal "DSi" from the main sense amplifier 51 shows a change from low level to high level when the line segment (1) across the threshold voltage 3.0 V.

In the other hand, if the signal "DDi" takes the second route represented by the line segment (2), then the output signal "DSi" from the main sense amplifier 51 remains at the high level.

The following output waveforms may be considered for the dummy sense amplifier 52 for generating data latch pulse signals.

Since the initial state of the memory cells are in the ON state, the waveform of the signal takes the line segment (1) from a point "P1" to the point "O". The threshold voltage level of the invertor, into which the signal "DDi" from the differential amplifier is inputted, is set at a voltage level "VL1" 4.0 V which is higher than the point "O" 2.5 V and threshold voltage "V1" 3.0 V. Output signal "DS" from the dummy sense amplifier 52 is risen just prior to commencement of rising the signal "DSi" from the main sense amplifier 51.

The signal "DS" from the dummy sense amplifier 52 is inputted into the data displacement detection circuit 9 and a signal "DR" is outputted from the data displacement detection circuit 9. The signal "DR" is risen with synchronous to the rising of the signal "DS".

Subsequently, the signal "ATP" is fallen to the low level, whereby the main sense amplifier 51 and the dummy sense amplifier 52 are commenced to detect cell states of the main memory cell array 71 and the dummy memory cell array 72.

There may be considered the following two output waveforms from the main sense amplifier 51. One is the read out from the cells in the ON state wherein the waveform corresponds a line segment (1) from a middle point "O" to a point "P3". Another is the read out from the cells in the OFF state wherein the waveform corresponds a line segment (2) from a middle point "O" to a point "P4".

If the signal "DDi" takes the line segment (3), the signal "DSi" is changed from high level to low level when the line segment (3) across the threshold voltage V1.

On the other hand, if the signal "DDi" takes the line segment (4), the signal "DSi" remains fixed at the high level.

Output signal from the dummy sense amplifier 52 for generating data latch signals takes the line segment (3) from the middle point "O" to the point "P3" Since the threshold voltage level of the invertor 514 into which the signal "DS" is inputted, is set a voltage level "VL1". The signal "DS" from the dummy sense amplifier is risen just after output signals from the main sense amplifier 51 are risen.

The signal "DS" from the dummy sense amplifier 52 is inputted into the data displacement detection circuit 8 and the signal "DR" is outputted from the data displacement detection circuit 8. The signal "DLS" is fallen to the low level in synchronous to the fall of the signal "DR" after the delay time "tD".

The signal "DLS" is fallen whereby the signal "DSi" from the main sense amplifier 51 is latched and the signal "Di" is outputted.

If the delay time "tD" is set short, the signal "Di" is latched almost at the same time as the output from the main sense amplifier 51 is decided, for which reason the timing of generation of the data latch signal "DLS" is automatically set at the optimum value without consideration of the power source voltage variation.

Figure 12:
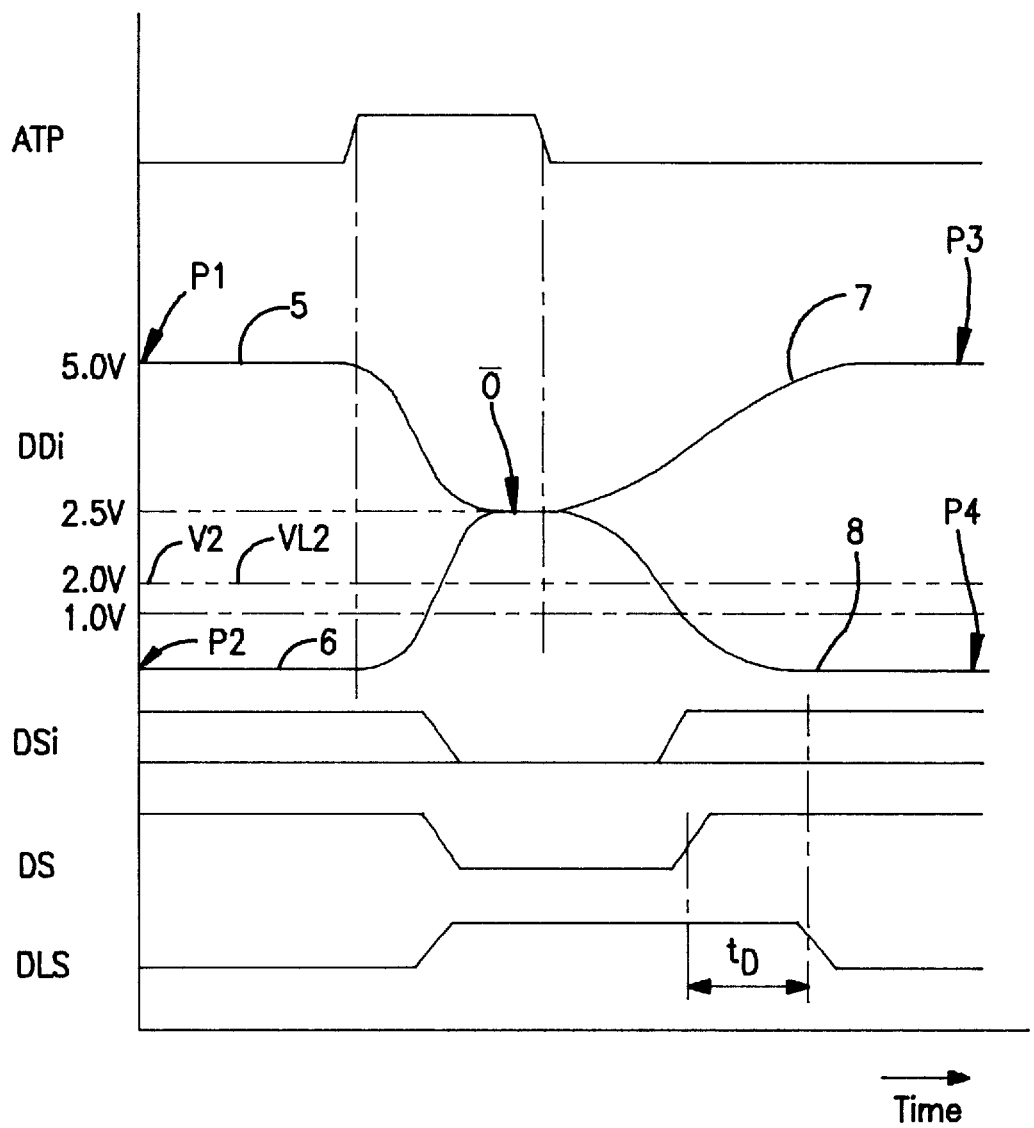
FIG. 12 is a diagram illustrative of waveforms of signals transmitted on the circuit of FIG. 10.

Subsequently, operations of the circuits, when all of the dummy memory cells in the dummy memory cell array 72 are in the OFF state, will be described with reference to FIG. 12 which is a diagram illustrative of waveforms of signals transmitted on the circuit of FIG. 10.

When all of the dummy memory cells in the dummy memory cell array 72 are in the OFF state, the threshold voltage of the invertor into which the signal "DDi" from the differential amplifier stage of the main sense amplifier 51 is inputted is set at a voltage level "V2" lower than the threshold voltage level "O". The threshold voltage of the invertor into which the signal "DDi" from the differential amplifier stage of the dummy sense amplifier 52 is inputted is set at a voltage level "VL2" 1.0 V lower than the threshold voltage level "O" and the voltage "V2"2.0 V.

Figure 13:
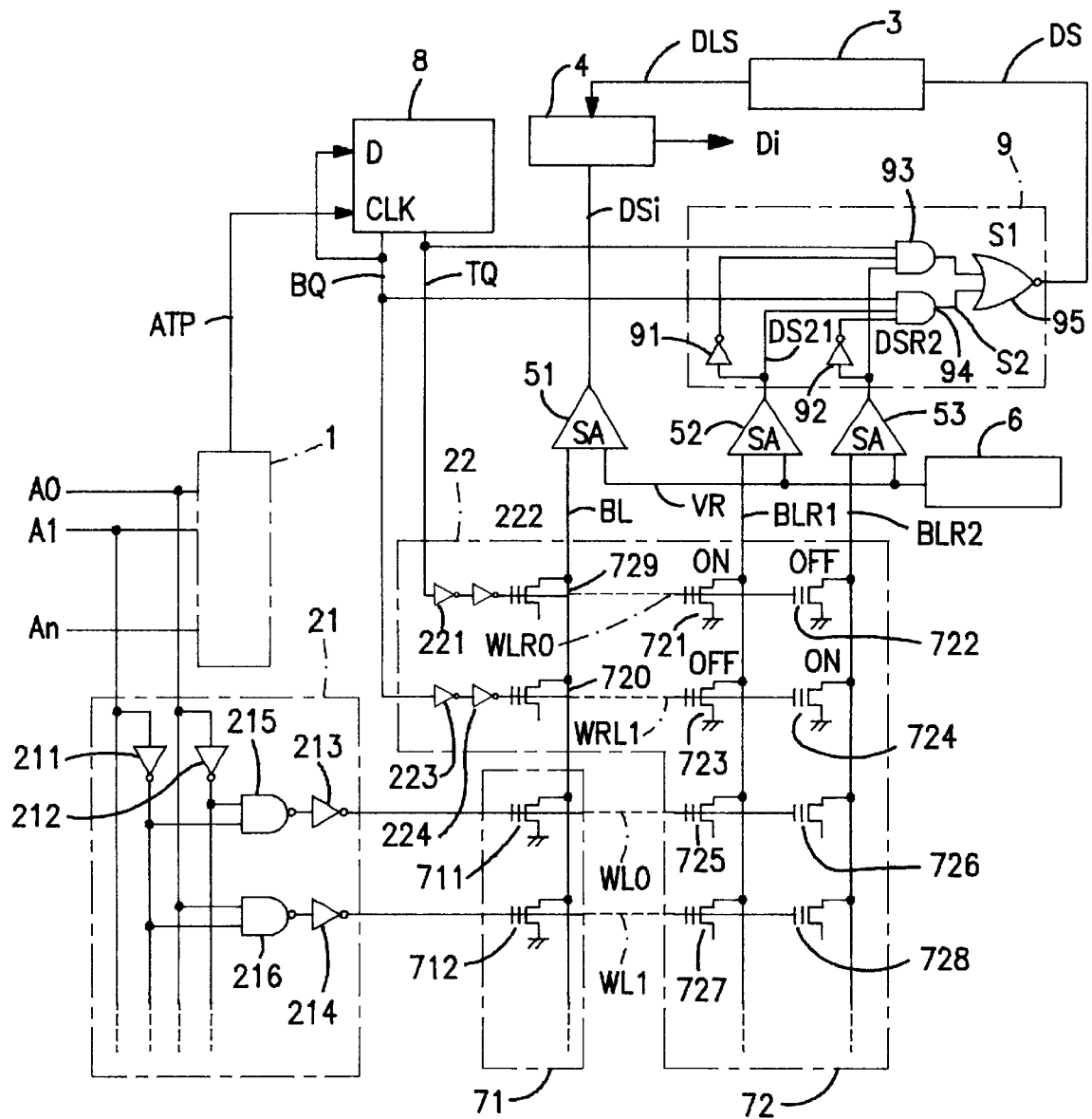
FIG. 13 is a circuit diagram illustrative of a data latching circuit for latching data read out from memory cells in a second embodiment according to the present invention.
Figure 14:
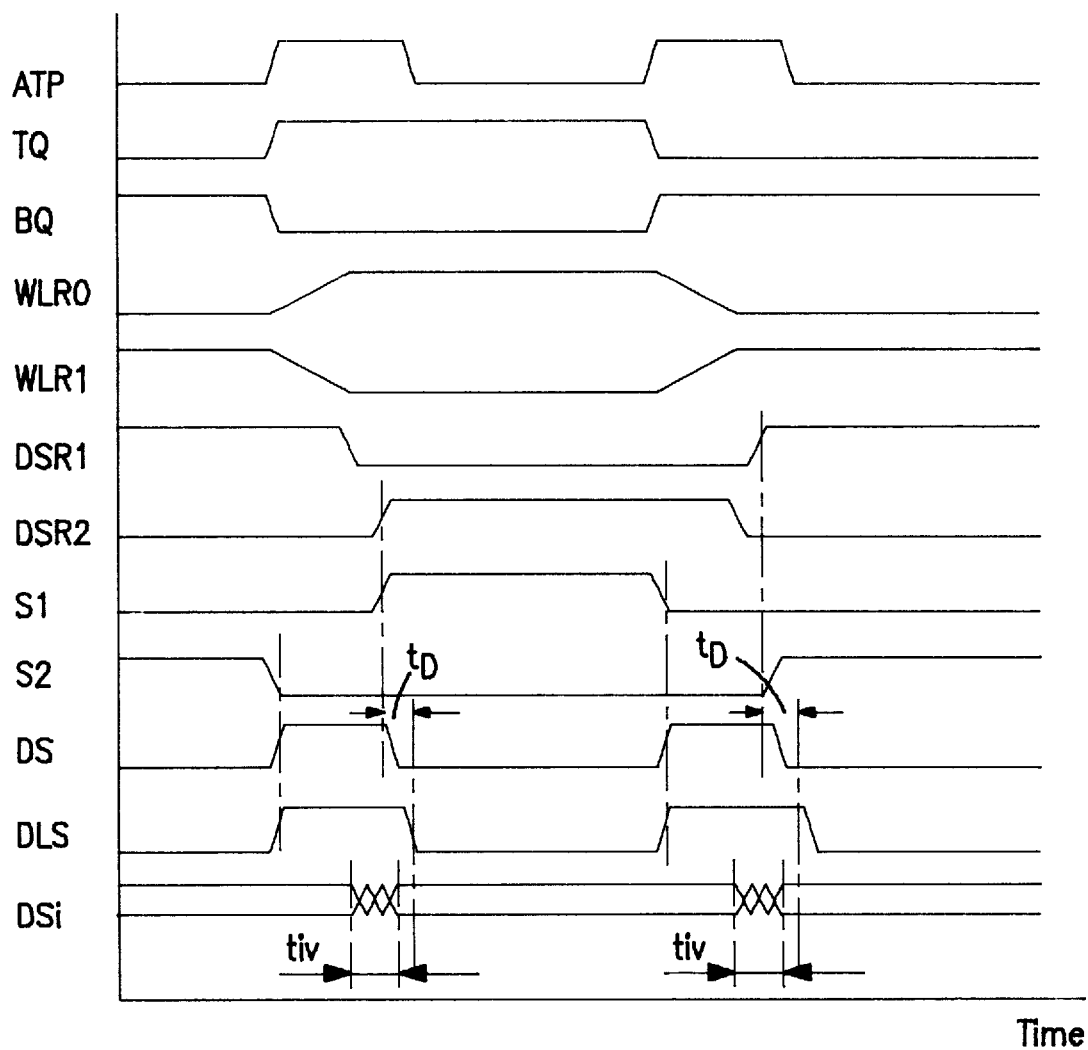
FIG. 14 is a diagram illustrative of waveforms of signals transmitted in the circuit of FIG. 13.

A second embodiment according to the present invention will be described in detail with reference to the accompanying drawings. FIG. 13 is a circuit diagram illustrative of a data latching circuit for latching data read out from memory cells in a second embodiment according to the present invention. FIG. 14 is a diagram illustrative of waveforms of signals transmitted in the circuit of FIG. 13.

The data latching circuit has the following circuits. An address displacement detection circuit 1 is provided for receiving inputs of address signals "A0"–"An" and outputting a signal "ATP" when the address signals are changed. An address decoder circuit 21 is provided for receiving inputs of the address signals "A0"–"An" to decode the address signals "A0"–"An" and outputting the decoded signals onto word lines "WL0", "WL1"–. A driver circuit 22 is provided for activating the word lines "WLR0", "WLR1" in accordance with the signal "TQ" and signal "BQ". A delay circuit 3 is provided for receiving an input of the signal "DS" and outputting a delay signal "DLS". A data latching circuit 4 is provided for latching the signals "DSi" received from a main sense amplifier 51 in accordance with the signal "DLS" and outputting data signals "Di".

Further the following circuits are provided. A main sense amplifier circuit 51 is provided for comparing currents on a bit line "BL" with currents on a reference bit line "VR" and outputting signals "DSi" of data read out from a main memory cell 71. Dummy sense amplifiers 52 and 53 are provided for comparing currents on bit lines "BL1" and "BL2" with currents on the reference bit line "VR" and outputting signals "DSR1" and "DSR2" of data read out from a dummy memory cell 72. A reference voltage generation circuit 6 is provided for deciding currents on the reference bit line "VR". A main memory cell array 71 is provided which includes transistors each having a floating gate connected to the word line, a source connected to the ground line and a drain connected to the bit line "BL1". A dummy memory cell array 72 is provided which includes transistors each having a floating gate connected to the word line, a source connected to the ground line and a drain connected to the bit line "BLR2" or "BLR2".

Further more the following circuits are provided. A pulse counter 8 is provided for receiving with clock terminals (CLK) pulse signals "ATP" from the address displacement detection circuit 1 to count the number of the pulses and outputting signals "TQ" and "BQ". A data displacement detection circuit 9 is provided for receiving inputs of the signals "DSR1", "DSR2", "TQ" and "BQ" and outputting a signal "DS".

FIG. 14 is a diagram illustrative of waveforms of signals transmitted in the circuit of FIG. 13, wherein all of the dummy memory cells in the dummy memory cell array 72 are in the ON state. Address signals "A0"–"An" and word signals "WL0"–"WL1" are omitted from FIG. 8.

When address signals "A0"–"An" are inputted, the address displacement detection circuit 1 outputs the signal "ATP" in the high level and selects the word line.

The counter 8 outputs a toggle signal in the high or low level as the signal "TQ" every when receipt of the high level pulse signal as the signal "ATP" as well as outputs a complimentary signal as the signal "BQ" with an inverse phase to the signal "TQ".

The driver circuit 22 into which the signals "TQ" and "BQ" have been inputted activates the selected word line.

In FIG. 14, during the first pulse of the signal "ATP", the word line "WLR0" is selected. During the second pulse of the signal "ATP", the word line "WLR1" is selected. In the memory cell transistor array 72, the memory cell transistors 721 and 724 are ON-cells whilst memory cell transistors 722 and 723 are OFF-cells. The remaining transistors 720, 725–729 are transistors wherein a gate is connected to the word line, the drain is connected to the bit line and a source is opened.

For example, during the first pulse of the signal "ATP", the word line "WLR0" is selected and also the memory cells 721 and 722 are selected. Informations of the selected memory cells are read out by the sense amplifiers 52 and 53 and signals "DSR1" and "DSR2" are outputted from the sense amplifiers 52 and 53.

Since the sense amplifier 52 is reading out the data from the ON-state memory cell, the signal "DSR1" is outputted in the low level. Since the sense amplifier 53 is reading out the data from the OFF-state memory cell, the signal "DSR2" is outputted in the high level.

Subsequently, the data displacement detection circuit 9 detects the timing of the delayed output of data from the memory cells by use of the signals "TQ", "BQ", "DSR1" and the inverted signals to the signal "DSR2".

The signal "DSR2" is latest. Upon receipt of the signal "DSR2", there is risen an output signal "S1" of the three-input AND gate 93 into which the signals "TQ", the inversion signal to the signal "DSR1" and the signal "DSR2" have been inputted.

In the data displacement detection circuit 9, a NOR gate 95, into which a signal "S1" was inputted, outputs a falling signal as the signal "DS" upon receipt of the rising signal as the signal "S1" and the signal "DS" is inputted into the delay circuit 3, The delay circuit 3 having received the signal "DS" causes only the falling signal to be delayed and outs the signal "DLS" as the delay signal.

The delay time is a time represented by "tD" in FIG. 14. The signal "DLS" is inputted into the data latch circuit 4 sot hat the data latch circuit 4 latches the signal "DSi" from the main sense amplifier and outputs data "Di".

For generation of the data latch signal, both the ON-cells and OFF-cells of the memory cells are used so that the data latch signal is generated in synchronous to later one of the read out signals, for which reason the data latching signal "DLS" is automatically set at the optimum or minimum value without consideration of the power voltage variation.

The above data latch circuit is applicable to when no initial equalization operation is made for the sense amplifier.

From the above descriptions, it can be understood that it is possible to latch data immediately after the data have been read out from the main memory. As signals for latching the output data from the sense amplifier, dummy memory cell data are read out from the dummy memory cell array at the same time when the main memory cell data are read out from the main memory cell array so that a data latching signal for latching data from the main memory cells is generated at the timing of reading out dummy cell data from the dummy memory cells. As a result, there is caused no variation in timing of latching the output data even if the power voltage varies. This means the latch circuit is free from the problem with latching the error data.

Main memory cell data are latched immediately after the data have been outputted from the main memory cells, for which reason it is possible to set quickly the timing of the activation of the output buffer, resulting in an improvement in the speed of the read out operation.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims any modifications of the present invention which fall within the spirit and scope of the present invention.

What is claimed is:

1. A circuit for latching data in read out operation of data from a main memory cell array, comprising:

dummy memory cells which have substantially the same structure as main memory cells;

bit lines connected to said main memory cells and to said dummy memory cells, all said bit lines having the same line width and line spacing;

a main sense amplifier for reading out data from the main memory cells;

a dummy sense amplifier for reading out data from the dummy memory cells;

a data latching circuit for latching the data outputted from the main sense amplifier, wherein read out operations from the dummy memory cells are made at the same time as the read out operations from the main memory cells so that the data latch circuit latches data outputted from the main sense amplifier by utilizing the timing when the dummy sense amplifier outputs data of the dummy memory cells.

2. A circuit for reading out data from the main memory cells, comprising:

main memory cells;

a main sense amplifier;

a data latching circuit for latching data read out from the main memory cells in accordance with a data latching signal;

a data latching signal generator for generating a data latching signal, wherein the data latching signal generator is further provided with dummy memory cells, a dummy sense amplifier for reading out data from the dummy memory cell, a data displacement detecting circuit for detecting data displacement points at a time when the dummy sense amplifier outputs data obtained from the dummy memory cell, and a delay circuit for receiving a data displacement detection signal from the data displacement detecting circuit as an input and outputting the data latching signal as a delay signal of the data displacement detection signal.

3. The circuit as claimed in claim 2, wherein data are read out from the dummy memory cells so that the data latching signal is outputted at a time when the data are outputted so as to latch the data of the main memory cells.

4. The circuit as claimed in claim 2, wherein the data latch signal generator is provided with dummy memory cells which have the same structure as the main memory cells, a dummy sense amplifier for reading out the data from the dummy memory cells, a data displacement detection circuit for detecting a data displacement point at a time when the dummy sense amplifier outputs data of the dummy memory cells and outputs a data displacement detection signal, a delay circuit for receiving the input of the data displacement detection signal and outputting the data latch signal as the delay signal of the data displacement detection signal.

5. The circuit as claimed in claim 2, wherein the data are read out from the dummy memory cells at the same time when the data are read out from the main memory cells so that the sense amplifier for the dummy memory cell outputs the dummy memory cell data, and at the same time data are read out from the main memory cells and outputted as correct data, whereby the data latching signal is output for latching data of the main memory cells at the timing when the sense amplifier of the dummy memory cells outputs the dummy memory cell data.

* * * * *